United States Patent [19]

Reed

[11] Patent Number: 4,476,585
[45] Date of Patent: Oct. 9, 1984

[54] BASEBAND DEMODULATOR FOR FM SIGNALS

[75] Inventor: Joseph Reed, Stamford, Conn.

[73] Assignee: International Telephone and Telegraph Corporation, New York, N.Y.

[21] Appl. No.: 342,442

[22] Filed: Jan. 25, 1982

[51] Int. Cl.³ .............................................. H04B 1/26
[52] U.S. Cl. ..................................... 455/207; 329/50;
        329/124; 375/80; 455/209; 455/264; 455/316;
                                                    455/324
[58] Field of Search ............... 455/207, 208, 209, 214,
        455/258, 264, 316, 318, 319, 324, 337, 42, 59,
        60, 61; 375/39, 44, 78, 80; 329/50, 122, 124

[56] References Cited

U.S. PATENT DOCUMENTS 4,348,641 9/1982 Scott et al. ........................ 329/124

Primary Examiner—Marc E. Bookbinder
Attorney, Agent, or Firm—John T. O'Halloran; Peter R. Ruzek

[57] ABSTRACT

A demodulator of the type employed in a "zero-IF" system uses a local oscillator for providing guadrature output signals at the center frequency of an FM signal to be demodulated. The demodulator has first and second mixers for separately mixing the FM signal with the quadrature signals to provide a first and second output signal each in quadrature at the outputs of said mixers. These signals are low pass filtered. The demodulator includes third and fourth mixers with each mixer receiving at an input one of the low pass signals. At another input the mixers receive third and fourth signals. The third and fourth signals are derived from mixing a variable controlled oscillator (VCO) signal with the local oscillator guadrature signals. The outputs of the third and fourth mixers are applied to the inputs of a difference amplifiers, the output of which controls the frequency of the VCO in an automatic frequency control mode (AFC) to cause the output of the difference amplifier to provide demodulated signal.

A switching means operates to alternate the third and fourth signals as applied to the input of the third and fourth means as well as the output as applied to the difference amplifier to cause an additional amplifier coupled to the outputs of the mixers to provide a DC control signal used for automatic gain control.

13 Claims, 2 Drawing Figures

BASEBAND DEMODULATOR FOR FM SIGNALS

BACKGROUND OF THE INVENTION

This invention relates to a demodulator and more particularly to a baseband demodulator for FM signals.

In regard to the field of radio receivers there has been a concentrated effort over the past several years to reduce the amount of tuned circuitry employed in such devices. In obtaining a reduction in the number of tuned circuits one is able to integrate large portions of the receiver and hence produce radio receivers which are extremely compact. These receivers are employed in many areas such as in selective paging systems and so on. A major breakthrough in the design of such receivers is a technique referred to as "zero -IF."

The zero-IF technique has been described in British Patent No. 1,530,602 entitled DEMODULATOR FOR FM SIGNALS published on Nov. 1, 1978 for I. A. W. Vance. Essentially in such a system, there is present a receiver in which local oscillator signals in phase quadrature at the carrier frequency are each separately mixed with the incoming audio modulated signals. The resulting signals have zero-IF with the two sidebands folded over on each other at the baseband and extending in frequency from DC to the single sideband width of the original signal.

In the case of FM modulation the folding of the sidebands makes it impractical to demodulate the signal. In the British Patent the mixer outputs are low pass filtered and then amplified to a standard limit. After amplification, the two signals are separately differentiated. Each differentiated signal is then multiplied by the input to the other differentiator and one of the multiplier outputs is substracted from the other. This technique is also described in U.S. Pat. No. 4,238,850 entitled TRANSMITTER/RECEIVER FOR SINGLE CHANNEL DUPLEX COMMUNICATION SYSTEMS issued on Dec. 9, 1980 to I. A. W. Vance and assigned to International Standard Electric Corporation.

In such systems, one may employ a phase-locked loop demodulator operating at the carrier frequency. The local oscillator of such a system follows the signal and the control voltage for such a local oscillator is therefore proportional to the signal deviation plus a constant. If the constant is removed, as for example by coupling, then the output is a replica of the deviation and therefore represents the modulation.

The difficulty with the demodulators of the prior art is that the stability of the criteria for the phase-locked loop prohibits sharp filters in the baseband. Accordingly, the adjacent channel selectivity suffers degradation and therefore such a receiver is extremely difficult to implement. Hence in recognizing this problem many prior art systems use two channels in phase quadrature. In this manner one could employ sharp filters and then one would operate on the filtered signals to demodulate them. In the present state of the art the techniques use in phase and quadrature and are referred to as I & Q systems. As indicated, these systems operate at baseband and have the capacity of detecting double sideband/single sideband, AM signals, as well as FSK type signals.

The present state of the art in I & Q channel receivers uses passive components for processing the baseband signals so that they can be demodulated. In the use of passive components one cannot employ feedback means to stabilize the receivers. In such systems each baseband signal may be differentiated, multiplied by the other undifferentiated signal and then summed. The other channel which may be the I or Q channel is treated in a similar manner. This technique is subject to the generation of noise and distortion because of circuit imbalances and imperfections. The phase errors in producing the in phase and quadrature channels generate either noise or distortions. If there is an error in tuning, beat notes are generated which further complicate and cause improper operations.

In addition to the above described problems are unbalanced components such as multipliers and other circuit components which also adds to the noise and circuit distortions. Furthermore, the output of such a system has amplitude variations, requiring tight automatic gain control or additional complicated circuitry to circumvent the resulting imperfections.

One can use digitizing techniques to operate on the baseband signals and then to demodulate them according to such techniques. In any event, this does not eliminate the above described problems and will further introduce additional problems of aliasing and high level signal generation as necessary to operate with digital equipment.

It is therefore an object of the present invention to provide a simple demodulator which employs two channel operation while avoiding the above noted problems. It is a further object to provide an improved baseband demodulator which employs automatic frequency control (AFC) to thus eliminate the off tuned condition.

As will be described, the demodulator according to this invention eliminates the deliterious effect of small imperfections in phase splitting the local oscillator. In addition, the circuit to be described can provide an automatic gain control (AGC) signal to allow higher dynamic range operation. In providing such features the circuit does not require high gain baseband signal amplifiers. In this manner the circuit can use fixed gain amplifiers or low gain amplifiers using AGC. This has the effect of permitting the use of amplifiers with large feedback factors so that the gain and balance between the two channels is improved.

As will be described, the demodulator according to this invention is analog in nature but is of such a configuration which enables it to be simply integrated on a circuit chip.

DESCRIPTION OF THE PREFERRED EMBODIMENT

A demodulator for frequency modulated (FM) signals comprises local oscillator means for providing first and second signals in phase quadrature at the center frequency of said FM signal, first and second mixing means for mixing said FM signal respectively with said first and second local oscillator signals, low pass filter means for filtering each of the outputs of said first and second mixing means, third and fourth mixing means with said third mixing means having one input coupled to the output of said low pass filter means associated with said first mixer, and with said fourth mixing means having the one input coupled to the output of said low pass filter means associated with said second mixing means, variable controlled oscillator (VCO) means having an output adapted to be applied to the other inputs of said third and fourth mixers, said VCO having a control input for controlling the frequency thereof, summing means having inputs coupled to the outputs of said third and fourth mixers to provide a difference signal at the output and control means coupled between the output of said summing means and the control input of said VCO to cause said output of said summing means to provide a demodulated signal indicative of the modulation on said FM signal.

DETAILED DESCRIPTION OF THE INVENTION

Figure 1:
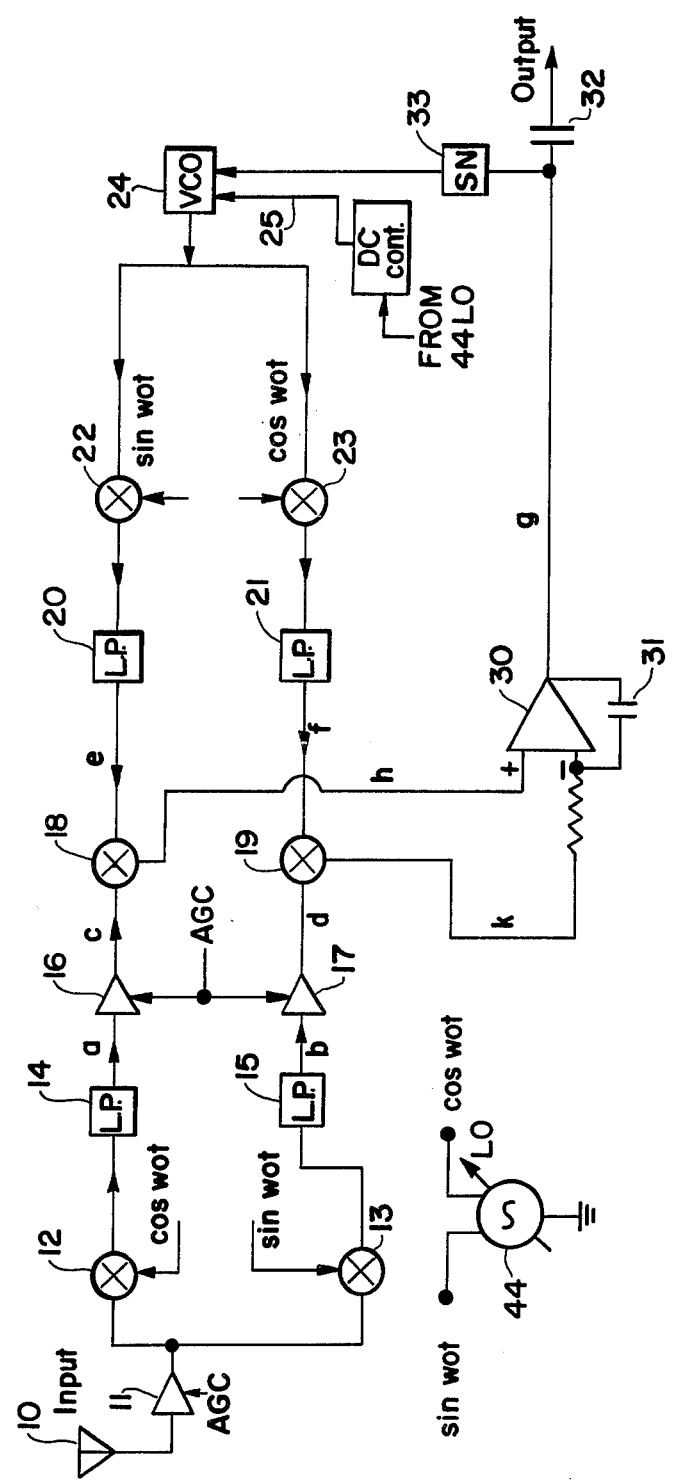
FIG. 1 is a block diagram of a baseband demodulator according to this invention.

Referring to FIG. 1, there is shown a block diagram of a receiver employing a baseband demodulator according to this invention. A transmitted FM signal is received by an antenna 10 and coupled to the input of a variable gain amplifier 11. Amplifier 11 has one input designated as AGC and, as will be explained, an AGC signal which is developed by the circuitry to be described can control the gain of the preamplifier 11. The output of amplifier 11 is directed to one input of a first mixer 12 and a second mixer 13. Mixer circuits are well-known in the art and many examples of suitable devices exist. Both mixers 12 and 13 receive an input from a local oscillator 44.

Essentially, the oscillator 44 includes a quadrature hybride or some suitable circuit to enable the oscillator to produce a first signal designated as $\sin w_o t$ and a second signal designated as $\cos w_o t$. As can be seen from FIG. 1, the mixer 12 receives the $\cos w_o t$ while the mixer 13 receives the $\sin w_o t$. The local oscillator 44 may be a conventional oscillator circuit or may be a frequency synthesizer or other device capable of being tuned or controlled over a desired band of operation.

Coupled to the output of mixer 12 is a low pass filter 14. The output of mixer 13 is similarly coupled to a low pass filter 15. The low pass filters 14 and 15 have a band width which is selected to be approximately equal to the accepted maximum deviation of the input signal from the local oscillator frequency. Thus at the output of the low pass filters 14 and 15 there are two signals in quadrature as will be made apparent. It is of course further understood that the local oscillator 44 has a frequency selected to provide the first and second signals which are in phase quadrature at the center frequency of the FM input signal. These aspects of the zero-IF system are known in the prior art.

The output of low pass filter 14 is referenced by the letter (a) while the output of low pass filter is referenced by the letter (b). The output (a) of low pass filter 14 is coupled to the input of an amplifier 16 while the output of low pass filter 15 is coupled to the input of the amplifier 17. The amplifiers 16 and 17 may be conventional integrated circuit amplifiers of the type exhibiting gain control, which as will be explained is implemented by the AGC signal applied to the control terminals of amplifiers 16 and 17. As such, amplifier configurations for 16 and 17 are well-known in the art and many examples exists.

As one can see from FIG. 1, the output of amplifier 16 is designated as (c) while the output of amplifier 17 is designated as (d). The (c) output from amplifier 16 is coupled to one input of a second mixer or multiplier 18 basically of similar configuration to mixer 12. The output (d) of amplifier 17 is coupled to one input of another mixer 19 also of the same configuration as mixer 18. The other input for mixer 18 is derived from the output (e) of a low pass filter 20.

In a similar manner, the other input of mixer 19 is derived from the output (f) of a low pass filter 21. The low pass filter 20 has its input coupled to the output of mixer 22, while the input of low pass filter 21 is coupled to the output of an additional mixer 23. Mixer 22 receives the signal $\sin w_o t$ as does mixer 13, while mixer 23 receives the signal $\cos w_o t$ as does mixer 12. The other inputs of mixers 22 and 23 are derived from a voltage controlled oscillator (VCO) 24, which can be varied in frequency.

As will be explained, the VCO 24 has one input 25 which will receive a DC control voltage derived from the local oscillator 44 in order to set or tune the VCO to a desired frequency. Thus as one can see from FIG. 1 the upper channel includes three mixers 12, 18 and 22 while the lower channel includes three mixers as 13, 19 and 23. The output of mixer 18 designated as (h) is applied to the positive input terminal or non-inverting terminal of an operational amplifier 30.

In a similar manner, the output of mixer 19 designated as (k) is applied through a resistor to the inverting terminal of operational amplifier 30. The operational amplifier 30, as will be explained, may be arranged as an integrator and has a capacitor 31 coupled between the output terminal (g) and the inverting terminal. The output terminal (g) of the operational amplifier is AC coupled through a capacitor 32 to provide an output signal which is indicative of the modulation on the input signal as received by antenna 10, as will be explained.

The output of amplifier 30 is also coupled through a stabilizing network (SN) 33. The stabilizing network is used to control the frequency of the VCO 24 and hence, as will be explained, assures that errors which are inherent in prior art systems are eliminated. In this manner, frequency control of the VCO 24 assures that the output is always proportional to the modulation and that any errors due to the imbalance between the two channels is cancelled or substantially reduced because of the automatic frequency control provided.

The operation of the above described system can best be explained in terms of the mathematical relationships which govern the operation. In the following equations which describe operation, the various signals will be designated in regard to the smaller case letters used such as the output of low pass filter 14 designated by (a), the output of amplifier 16 designated by (c) and so on. The equations also use constants such as A, D and so on. The various constants used in the equations differ one from the other to indicate amplitude and various gain effects. In order to understand operation it is assumed that the input waveform as received by antenna 10 and as amplified by the preamplifier 11 and applied to the input of mixers 12 and 13 is as follows:

$$A' \sin (w_c t + \delta)$$

where $w_c$ is the carrier frequency and $\delta$ is a time function representing the modulation
$A'$ = some amplitude Then at terminal (a) which is the output of L.P. 14 one obtains:

$$A'' \sin (w_c - w_o)t + \delta)$$

This signal is further amplified by amplifier 16 to produce at terminal (c)

$$A \sin[(w_c - w_o)t + \delta] \quad (I)$$

Similarly at terminal (d) which is the output of amplifier 17 one obtains:

$$A \cos[(w_c - w_o)t + \delta] \quad (II)$$

In the "zero-IF" system normally frequency $w_o$ is set so that it equals $w_c$, therefore equations (I) and (II) reduce to:

$$A \sin \delta \quad (I')$$

$$A'' \cos \delta \quad (II')$$

where A and A" may be the same or slightly different
It is assumed that some error in this setting exists so that:

$$(w_c - w_o) = \Omega_1$$

where $\Omega_1$ is the error in setting. Now, the DC control voltage of VCO 24 will be supplied from the frequency setting for $w_o$ setting the VCO 24 to some frequency $w_a$ near $w_o$. The DC control on line 25 provides a signal according to the setting or tuning of the local oscillator 44. This control signal tunes the VCO 24 to a frequency close to but not necessarily equal to $w_o$. Assume the output of the VCO 24 to be:

$$\text{VCO output} = D' \sin(w_a t + \beta)$$

where $\beta$ is an arbitrary phase which may be time variable
D'=some amplitude different from or equal to A.
Then at terminal (e) the output is:

$$D \cos[(w_a - w_o)t + \beta] = D \cos(\Omega_2 t + \beta) \quad (III)$$

where $\Omega_2$ is error in setting $w_a$ $$\Omega_2 = (w_a - w_o)$$

And at terminal (f) the output is:

$$D \sin[(w_a - w_o)t + \beta] = D \sin(\Omega_2 t + \beta) \quad (IV)$$

where $\Omega_2$ is error in setting $w_a$
The signals at terminals (c) and (e) are presented to mixer 18. The mixer 18 may also be a multiplier as is known. For example, if the signal levels are low enough to avoid switching a mixer, it is a multiplier and one obtains at (h):

$$I \times III = AD \sin(\Omega_1 t + \delta) \cos(\Omega_2 t + \beta) \quad (V)$$

And at terminal (k) as a result of mixer 19 action one obtains:

$$II \times IV = AD \cos(\Omega_1 t + \delta) \sin(\Omega_2 t + \beta) \quad (VI)$$

It may be seen that sine and cosine functions are supplied to the respective inputs of each of the mixers 18 and 19. Such mixing of different sinusoidal functions is perceived as a phase inversion. Conversely, no phase inversion would take place if only sine, or only cosine, functions were mixed in either of the mixers 18 or 19.

These two signals are subtracted by operational amplifier 30 resulting in:

$$AD\{\sin(\Omega_1 t + \delta)\cos(\Omega_2 t + \beta) - \cos(\Omega_1 t + \delta)\sin(\Omega_1 t + \beta)\} \quad (VII)$$

$$= AD\{\sin[(\Omega_1 - \Omega_2)t + \delta - \beta]\}$$

Since this signal represents an error signal in a feedback loop, it will be driven towards zero. This can only occur when:

$$(\Omega_1 - \Omega_2)t + (\delta - \beta) \to 0$$

$$\Omega_1 = \Omega_2 \text{ thus } \delta = \beta$$

The result is that $W_a = w_c$ and we have an automatic AFC action.

Furthermore, since $\delta = \beta$ and $\beta$ is proportional to the voltage present at terminal (g) in the circuit, the output indicated is proportional to $\delta$. This represents the modulating signal and is in fact the demodulated output. Thus the output from capacitor 32 is the modulation on the original signal.

The capacitor 31 in FIG. 1 could in fact be replaced by a fixed resistor. In that case, the operational amplifier would no longer integrate the error signal $(\delta - \beta)$ and $\beta$ would no longer be an exact replica of $\delta$. With a high gain amplifier, however, this error could be made negligible, as is understood.

Under the condition, however, that the amplifier 31 is an integrator, and that voltage can exist at its output for a zero input, the error theoretically, at least, can be driven to zero. Then:

$$w_c - w_o = w_a - w_o \text{ (AFC)} \quad (VIII)$$

$$\delta = \beta \text{ (demodulation)}$$

Equation VIII indicates true automatic frequency control (AFC) with a demodulated output.

Figure 2:
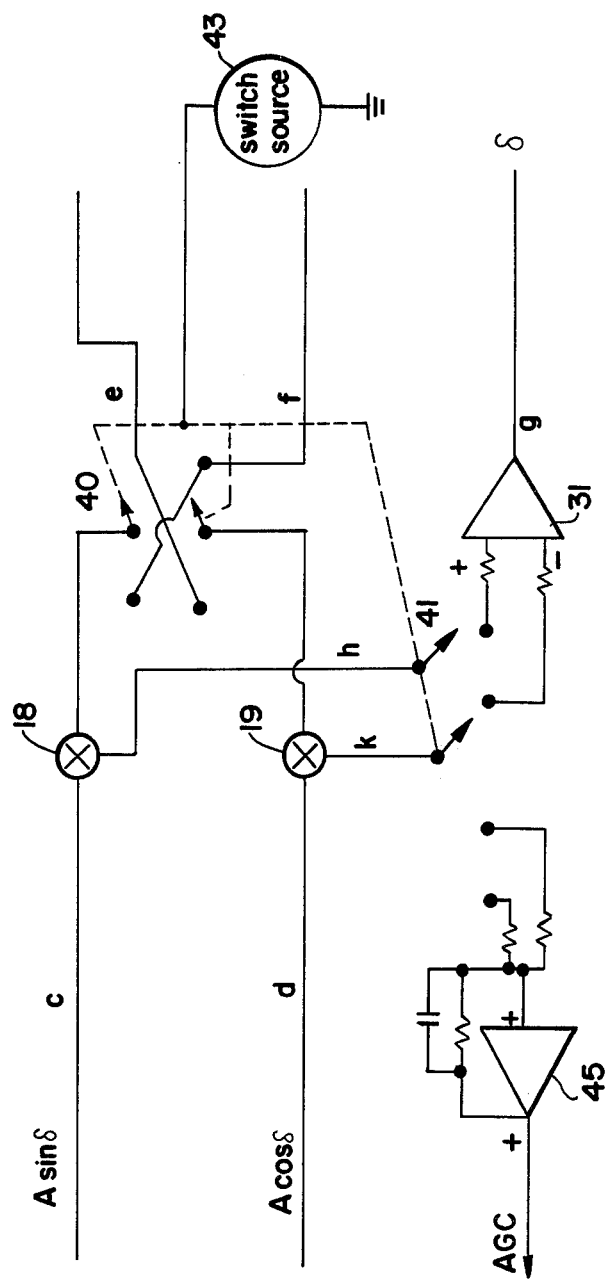
FIG. 2 is a simple block diagram depicting structure for deriving an automatic gain control signal (AGC) according to this invention.

Referring to FIG. 2, there is shown an apparatus for deriving an AGC signal which signal is used to control the gain of pre-amplifier 11, as well as amplifiers 16 and 17. In FIG. 2, similar reference numerals have been retained to designate similar functioning parts.

As explained above due to the AFC operation one is always assured that $w_c$, the carrier frequency is equal to $w_o$, the local oscillator frequency. Therefore the input to mixer 18 at c is $A \sin \delta$, while the input to mixer 11 at d is $A \cos \delta$. The inputs to mixers 18 and 19 from lines e and f via low pass filters 20 and 21 are directed to the inputs of mixers 18 and 19 through a first double pole—double throw(DPDT) electronic switch 40. The switch 40 may be a FET circuit or a MOS circuit, where the gate electrodes are controlled by a high frequency switching signal from a source 43. In this case the frequency of the switching signal is at least twice as high as the highest pass frequency of the input FM signal to satisfy the Nyquist theorem. DPDT switches as 40 are well-known in the art and are available from many sources. In a similar manner the outputs of mixers 18 and 19, k & h are applied to the input terminals of a second DPDT switch 41. Switch 41 switches the outputs between amplifier 30 and a second amplifier 45. The output of amplifier 30, still provides a signal proportional to $\delta$ and therefore a signal indicative of the modulation. The output of amplifier 45 provides a DC signal which is proportional to the amplitude of the appropriate waveforms in the system and which signal is directly used for AGC control.

MODE OF OPERATION FOR AGC

Regarding FIG. 2, AGC is implemented as follows:

If the phases of the second set of frequencies (i.e. those having the $\Omega_2$ term in them) as supplied to the corresponding inputs of the respective mixers 18 and 19 were not inverted with respect to the first set of frequencies (i.e. those having the $\Omega_1$ in them), one would obtain:

$$AD \sin (\Omega_1 t + \delta) \cdot \sin (\Omega_2 t + \beta) \quad (1)$$

$$AD \cos (\Omega_2 t + \delta) \cdot \cos (\Omega_2 t + \beta) \quad (2)$$

Substracting in the same way as above in the operational amplifier 30, we would get:

$$AD \left[ -\cos (\Omega_1 t + \delta + \Omega_2 t + \beta) \right]$$

which is not a useful output. However, when the phases are not inverted and we sum under the constraint that $\Omega_1 = \Omega_2$ and $\delta = \beta$, then we get (let $\Omega_1 = \Omega_2 = 0$):

$(1) + (2) = AD \ [\sin^2 \delta + \cos^2 \delta] = AD$. This is a DC term which provides AGC voltage. This can be accomplished by reversing the drive to the two mixers 18 and 19 at a rate high enough to be beyond the passband of the system as shown in FIG. 2.

As will be further explained, the circuit of FIG. 1 discriminates against most typical imperfections found in prior art devices. The nature of operation is again best described by mathematics as follows:

SELF CORRECTING FEATURES

Let us now examine noise/errors due to several possible circuit imperfections.

Assume that the frequency $w_o$ cannot be split precisely with two waves 90° apart in phase. This represents an unavoidable error in phase splitting. We can assume that instead of $\sin w_o t$; $\cos w_o t$ we have: $\sin w_o t$ and $\cos (w_o t - \phi)$ where $\phi = 0°$ to 90°

Then at the first mixers as 18 and 19, one obtains:

$$\sin (w_c t \delta) \cdot \cos (w_o t - \phi)$$

and $$\sin (w_c t + \delta) \cdot \sin (w_o t)$$

Resulting in low pass terms from filters 14 and 15 as:

$$A \sin (w_c - w_o) t + \delta + \phi$$

and $$A \cos (w_c - w_o) t + \delta$$

Similarly, we have at the terminals (e) and (f) of FIG. 1:

$$D \cos [(w_a - w_o) t + \beta]$$

$$D \sin [(w_a - w_o) t + \beta + \phi]$$

Let $w_c - w_o = w_a - w_o = 0$
Then we have at points (k) and (h) of FIG. 1 as inputs to amplifier 30 the following:

$$AD \sin (\delta + \phi) \cos \beta$$

$$AD \cos \delta \sin (\beta + \phi) \beta$$

Expanding term-wise:
$$AD \sin (\delta + \phi) \cos \beta = AD (\sin \delta \cos \phi + \cos \delta \sin \phi) \cos \beta$$

$$AD \cos \delta \sin (\beta + \phi) = AD (\sin \beta \cos \phi + \cos \beta \sin \phi) \cos \delta$$

Subtracting (k) from (h) as before we have:
$$AD \cos \phi \sin [(\delta - \beta)] \to 0 \text{ as } \beta \to \delta$$

The only effect of an imperfect phase split is a reduction of sensitivity by the mixer, multiplier; $\cos \phi \to 1$ as $\phi \to 0$ that small errors are negligible.

The circuit is, therefore, self compensating for imperfect phase splitting.

In a similar manner, it can be demonstrated that distortion products (and or errors) introduced because of inadvertent gain differences between the channels are not greater than those introduced in similar receivers not using these techniques. In fact most gain differences produce half the ammount of distortion/error other systems produce. It is in fact possible by using a second switching system as described for AGC operation to produce correcting AGC voltage for balancing the channel gains.

Due to the above described operation the baseband demodulator or receiver can employ narrow band filters or sharp filters without causing loop instability. The use of the VCO control enables mixers 18 and 19 to provide reliable operation over a wide range while assuring that the VCO frequency is properly controlled.

Errors in both the phase generator such as the quadrature circuit and the local oscillator as well as signal errors are compensated for. The circuit by the use of a high switching rate enables one to develop an AGC signal for proper control of all channel and common amplifiers according to the magnitude of the true output signal. The system further enables one to demodulate either in or out of phase by alternating configurations as described.

We claim:

1. In a demodulator for an FM signal, said demodulator being of the type employing a local oscillator for providing quadrature output signals at the center frequency of said FM signal, and with first and second mixing means for separately mixing said quadrature signals with said FM signals to provide at their respective outputs resulting signals of a zero-IF with the sidebands folded over and extending in frequency from DC to the single sideband width of the original signal, low pass filter means associated with each output of said mixing means to provide a first and a second low pass filtered signal and having a predetermined highest pass frequency, the combination therewith of apparatus for operating on said first and second low pass filtered signals to demodulate said FM signal, comprising:
   third and fourth mixing means for respectively receiving said first and second low pass filtered signals at a first input,
   a variable controlled oscillator (VCO) having a control input and an output for providing a variable frequency,
   fifth and sixth mixing means each having one input coupled to said output of said VCO, and each having another input, with said other input of said fifth mixing means coupled to one output signal of said local oscillator, and with said other input of said sixth mixing means coupled to the other output signal of said local oscillator, with the output of said fifth mixing means coupled to a second input of said third mixing means, and with the output of said sixth mixing means coupled to a second input of said fourth mixing means, a difference amplifier having one input coupled to the output of said third mixing means and another input coupled to the output of said fourth mixing means for providing a difference signal at its output, and means for coupling the output of said difference amplifier to said control input of said VCO to vary said variable frequency so as to cause said output of said difference amplifier to provide a demodulated signal indicative of the modulation on said FM signal.

2. The demodulator according to claim 1 wherein said VCO further includes means responsive to said local oscillator frequency for controlling said VCO to provide an output frequency indicative of said local oscillator frequency.

3. The demodulator according to claim 1 further including first and second low pass filters with said first filter coupled between the output of said fifth mixing means and said second input of said third mixing means, with said second filter coupled between the output of said sixth mixing means and said second input of said fourth mixing means.

4. The demodulator according to claim 1 further including first and second amplifier means each having an output, input and gain control terminal, with the input of said first amplifier means being responsive to said first low pass filtered signal and with the output being coupled to said first input of said third mixing means, and with the input of said second amplifier means being responsive to said second low pass filtered signal and with the output being coupled to said first input of said fourth mixing means.

5. The demodulator according to claim 1 further including:

first switching means interposed between the outputs of said fifth and sixth mixing means and said first inputs of said third and fourth mixing means, and second switching means coupled to said outputs of said fifth and sixth mixing means and coupled in a first switching state thereof to said difference amplifier, said first and second switching means being operative at a high rate with respect to the highest pass frequency respectively to reverse the connections between said outputs of said fifth and sixth mixing means and said first inputs of said third and fourth mixing means, and to switch said output connections at said rate between said first switching state and a second switching state in which said outputs of said third and fourth mixing means are disconnected from said difference amplifier, an additional amplifier coupled to said switching means to be connected to receive said outputs of said third and fourth mixing means in said second switching state of said second switching means and operative to provide at its output a DC signal for providing gain control, and means for coupling said DC signal to said gain control terminals of said first and second amplifiers.

6. A demodulator for frequency modulated (FM) signals comprising:

local oscillator means for providing first and second signals in phase quadrature at the center frequency of said FM signal, first and second analog mixing means for mixing said FM signal respectively with said first and second local oscillator signals, respective low pass filter means each for filtering a respective one of the outputs of said first and second mixing means, third and fourth analog mixing means with said third mixing means having a first input coupled to the output of said low pass filter means associated with said first mixing means and with said fourth mixing means having one input coupled to the output of said low pass filter means associated with said second mixing means, variable controlled oscillator (VCO) means having two outputs carrying third and fourth analog signals in phase quadrature with one another and applied to respective second inputs of said third and fourth mixing means, said VCO means having a control input for controlling the frequency thereof, summing means having inputs coupled to the outputs of said third and fourth mixing means to provide an analog difference signal at its output, and control means coupled between the output of said summing means and said control input of said VCO means to cause said summing means to provide an analog demodulated signal indicative of the modulation on said FM signal.

7. The demodulator according to claim 6 wherein said variable controlled means includes a variable controlled oscillator (VCO) generating an output signal, and fifth and sixth means each having an input coupled to the output of said VCO, with said fifth mixing means and sixth mixing means being operative for mixing said VCO output signal with said first and second local oscillator signals to provide said third and fourth signals, with the output of said fifth mixing means coupled to said second input of said third mixing means and with an output of said sixth mixing means coupled to said second input of said fourth mixing means, with said first and second mixing means receiving said first and second local oscillator signals respectively and with said fifth and sixth mixing means receiving said second and first oscillator signals respectively.

8. The demodulator according to claim 6 wherein said local oscillator is capable of being tuned over a range of frequency, and means for providing a control voltage according to said tuning and means for applying said control voltage to said VCO for controlling the output frequency thereof according to said oscillator tuning.

9. The demodulator according to claim 6 wherein said local oscillator provides said first signal of the form $\cos w_o t$ and said second signal of the form $\sin w_o t$ where $w_o$ is $2\pi$ times of local oscillator frequency.

10. The demodulator according to claim 6 further including:

switching means coupling said second inputs of said third and fourth mixing means to said VCO means and coupling the outputs of said third and fourth mixing means in one switching state thereof to said summing means, a control amplifier having an input coupled to said switching means in another switching state thereof for providing a DC control signal for AGC when said switching means are switched at a high repetition rate.

11. The demodulator according to claim 7 further including low pass filtering means respectively interposed between the outputs of said fifth and sixth mixing means and said second inputs of said third and fourth mixing means.

12. The demodulator according to claim 10 wherein said switching means includes a first double throw double pole switch having first and second inputs with the first input coupled to the input of said third mixing means and said second input coupled to the input of said fourth mixing means and means for reversing said connections when said switch is operated at said high repetition rate.

13. The demodulator according to claim 6, and further including:
- switching means interposed between, and operative for temporarily reversing the connections between, said outputs of said VCO means and said second inputs of said third and fourth mixing means;
- a control amplifier having two inputs and and output and operative for issuing a signal on its output which is proportionate to the sum of the signals supplied to said inputs; and
- means for at least temporarily connecting said outputs of said third and fourth mixing means to said inputs of said control amplifier while said connections are reversed to obtain at said output of said control amplifier a DC control signal for AGC.

* * * * *